(12) United States Patent
Hollis et al.

(10) Patent No.: US 8,497,706 B2
(45) Date of Patent: Jul. 30, 2013

(54) ADJUSTABLE DATA DRIVERS AND METHODS FOR DRIVING DATA SIGNALS

(75) Inventors: Timothy M. Hollis, Meridian, ID (US); Bruce W. Schober, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 24 days.

(21) Appl. No.: 13/210,259

(22) Filed: Aug. 15, 2011

(65) Prior Publication Data

US 2013/0043900 A1   Feb. 21, 2013

(51) Int. Cl.
*H03K 19/094* (2006.01)

(52) U.S. Cl.
USPC ............. 326/87; 326/30; 327/109; 327/112

(58) Field of Classification Search
USPC ............ 326/30, 82–83, 86–87; 327/108–109, 327/112
See application file for complete search history.

(56) References Cited

U.S. PATENT DOCUMENTS

| | | | |
|---|---|---|---|
| 5,726,903 A | 3/1998 | Kerzman et al. | |
| 6,243,779 B1 * | 6/2001 | Devanney et al. | 710/305 |
| 6,310,494 B1 * | 10/2001 | Ehben et al. | 326/82 |
| 6,445,316 B1 * | 9/2002 | Hsu et al. | 341/120 |
| 7,161,851 B2 * | 1/2007 | Peterson et al. | 365/189.11 |
| 7,365,564 B2 * | 4/2008 | Kim | 326/30 |
| 7,523,430 B1 | 4/2009 | Patel | |
| 7,644,383 B2 | 1/2010 | Bartling et al. | |
| 7,961,008 B2 * | 6/2011 | Kim et al. | 326/87 |
| 8,030,961 B2 * | 10/2011 | Matsudera | 326/30 |
| 8,237,468 B2 * | 8/2012 | Nguyen et al. | 326/82 |
| 2007/0126468 A1 * | 6/2007 | Kim | 326/30 |
| 2011/0069782 A1 | 3/2011 | Wilson et al. | |

FOREIGN PATENT DOCUMENTS

JP    2006156803    6/2006

* cited by examiner

*Primary Examiner* — Jason M Crawford
(74) *Attorney, Agent, or Firm* — Dorsey & Whitney LLP

(57) ABSTRACT

Apparatuses and methods for driving input data signals onto signal lines as output data signals are disclosed. An example apparatus includes a detection circuit, a driver adjust circuit, and a data driver. The detection circuit is configured to detect a characteristic(s) of a group of input data signals to be driven onto adjacent signal lines. A characteristic could be, for example, a particular combination of logic levels and/or transitions for, the group of input data signals. The driver adjust circuit is configured to provide a driver adjustment signal based at least in part on a detection signal, that is provided by the detection circuit. A data driver is configured to drive a respective one of the group of input data signals as a respective one of the output data signals, wherein the data driver is adjusted based at least in part on the driver adjustment signal.

28 Claims, 6 Drawing Sheets

ADJUSTABLE DATA DRIVERS AND METHODS FOR DRIVING DATA SIGNALS

TECHNICAL FIELD

Embodiments of the present invention relate generally to data drivers, and more specifically, in one or more illustrated embodiments, to data drivers that are adjustable based at least in part on a characteristic(s) of data signals to be driven onto signal lines by the data drivers.

BACKGROUND OF THE INVENTION

Semiconductor integrated circuits are continually becoming smaller due to demands for device compactness and increased circuit complexity. Electrical circuitry have shrunken and are typically positioned in very close proximity to increase circuit density. As a result, closely positioned circuitry may influence the operation of one another. For example, output signal drivers often drive signals onto parallel signal lines that are in close proximity to one another, such as onto a data channel. Typical data channels have a plurality of closely spaced signal lines on which data signals are transmitted.

Due to the proximity of the signal lines, issues of crosstalk and pattern dependent impedance mismatch may cause signal transitions on one signal line to be affected by signal transitions on one or more adjacent signal lines. Signals on adjacent signal lines that are transitioning to opposite logic levels (e.g., representing different data states) may inhibit one or more of the signals from transitioning as quickly as desired due to crosstalk. As a result, the signals may take longer to reach a desired logic level thus compromising performance. Even in instances where a signal transitioning on a signal line that is adjacent to signal lines on which one or more of the signals is not transitioning or adjacent to signal lines on which one or more of the signals is not transitioning to another logic level may be affected by crosstalk.

Transitioning signals on adjacent signal lines may also result in pattern dependent impedance mismatch, as previously mentioned. Pattern dependent impedance mismatch may cause adjacent signal lines having transitioning signals to effectively change impedance from a nominal (e.g., expected) impedance. This may result in signal reflections on the signal line and signal interference, again compromising performance.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
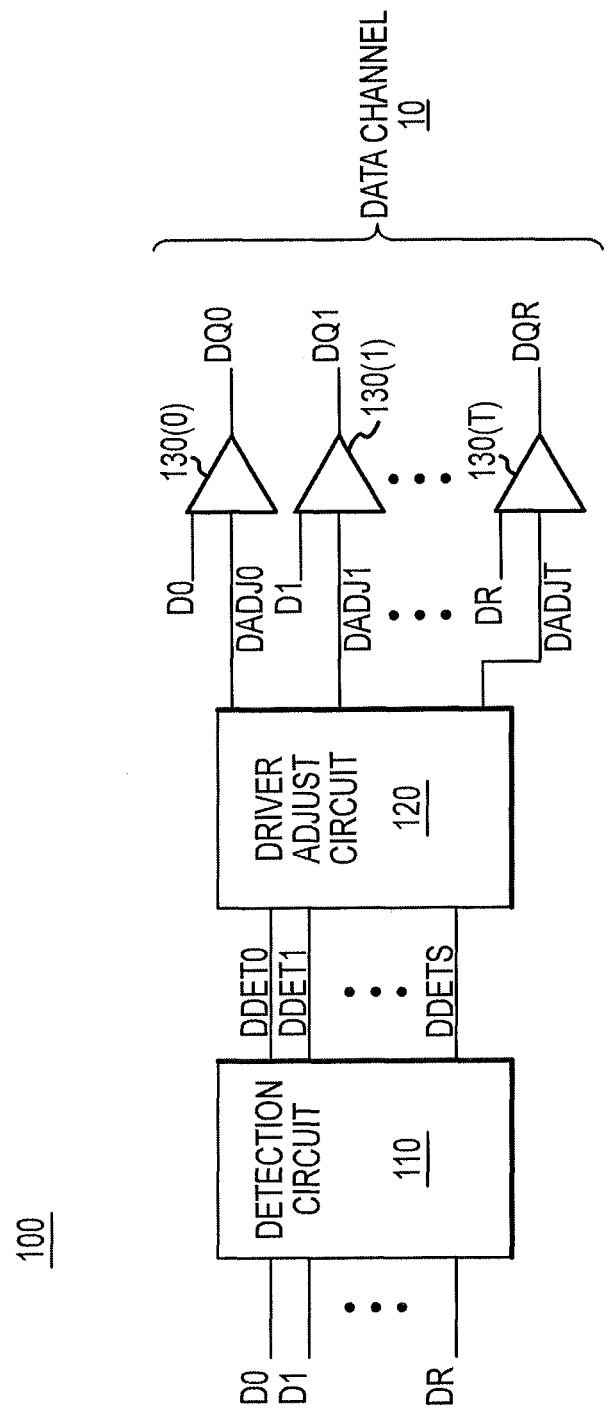
FIG. 1 is a block diagram of an output signal driver circuit according to an embodiment of the invention.

FIG. 1 illustrates an apparatus in the form of an output signal driver circuit 100 according to an embodiment of the invention. The output signal driver circuit 100 includes a detection circuit 110 configured to receive a group of data signals D0-DR and provide data detection signals DDET0-DDETS to a driver adjust circuit 120. The DDET0-DDETS signals have logic levels that are based at least in part on a characteristic(s) of the group of data signals D0-DR signals, as will be described in more detail below. The driver adjust circuit 120 provides driver adjustment signals DADJ0-DADJT having logic levels that are based at least in part on the DDET0-DDETS signals to adjust data drivers 130(0)-130(T) when driving the D0-DR signals as output data signals DQ0-DQR. The DQ0-DQR signals are driven by the data drivers 130(0)-130(T) onto respective signal lines of a data channel 10. The data drivers 130(0)-130(T) may be binary data drivers, or multi-level data drivers, with the data represented by various voltage levels. In some embodiments the data drivers 130(0)-130(T) have drive strengths adjusted based, at least in part, on the DADJ0-DADJT signals. In other embodiments the data drivers 130(0)-130(T) have driver impedances adjusted based, at least in part, on the DADJ0-DADJT signals. In some embodiments, the drive strength and the driver impedance may both be adjusted. Other data driver adjustments, however, may be made to the data drivers 130(0)-130(T) as well without departing from the scope of the present invention.

In operation, the output signal driver circuit 100 adjusts at least one of the data drivers 130(0)-130(T) based at least in part on a characteristic(s) of the D0-DR signals it receives. The detection of the characteristics of the D0-DR signals occurs before the output signals are driven so that the data drivers 130(0)-130(T) may be adjusted at the time the output signals are driven onto the signal lines of the channel 10. The adjustment of at least one of the drivers 130(0)-130(T) may address signal line crosstalk between adjacent data signal lines of the channel 10. The adjustment of one or more of the drivers 130(0)-130(T) may additionally or alternatively address signal reflections for the DQ0-DQR signals driven onto the channel 10 resulting from changes in signal line impedance from a nominal signal line impedance.

Figure 2:
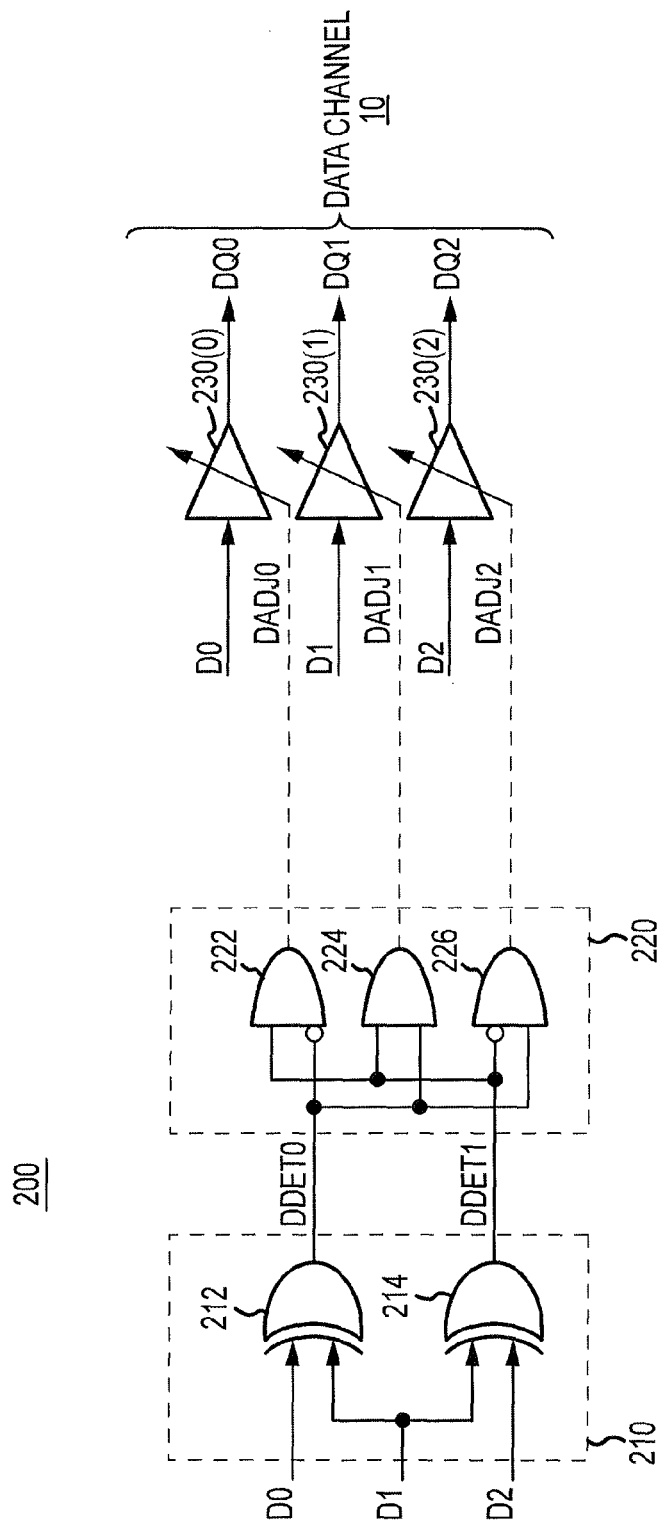
FIG. 2 is a schematic diagram of an output signal driver circuit according to an embodiment of the invention.

FIG. 2 illustrates an output signal driver circuit 200 according to an embodiment of the invention. The output signal driver circuit 200 includes a detection circuit 210 and a driver adjust circuit 220 for a group of three signals D0-D2 to be driven as output data signals DQ0-DQ2 on adjacent signal lines in channel 10. The detection circuit 210 includes XOR (exclusive OR) logic 212, 214 configured to receive the D0-D2 signals and provide DDET0 and DDET1 signals to AND logic 222, 224, 226 included in the driver adjust circuit 220. The DDET0 and DDET1 signals are based at least in part on the logic levels of the D0-D2 signals. The AND logic 222, 224, 226 provide DADJ0-DADJ2 signals based at least in part on the DDET0 and DDET1 signals that may be used to adjust data drivers 230(0)-230(2) when driving the D0-D2 signals onto the channel 10 as DQ0-DQ2 signals.

The output signal driver circuit 200 may adjust one or more of the data drivers 230(0)-230(2) based at least in part on a combination of logic levels of the D0-D2 signals. In some embodiments, the drive strengths of the data drivers 230(0)-230(2) may be adjusted. For example, based on the DADJ0-DADJ2 signals from the driver adjust circuit 220 the data drivers 230(0)-230(2) may be adjusted to drive a respective DQ0-DQ2 signal onto the channel 10 with increased drive strength. In another example, the data drivers 230(0)-230(2) may be adjusted to increase drive strength as well as decrease drive strength.

An example where the drive strength of at least one of the data drivers 230(0)-230(2) may be increased occurs when both D0 and D2 signals have high logic levels and the D1 signal has a low logic level. As a result, the XOR logic 212 provides a high logic level DDET0 signal and the XOR logic 214 provides a high logic level DDET1 signal. The high logic level DDET0 and DDET1 signals are provided to the AND logic 222, 224, 226. The AND logic 222, 226 in turn provide low logic level DADJ0 and DADJ2 signals to data drivers 230(0) and 230(2), respectively. The data drivers 230(0) and 230(2) may now be adjusted when driving high logic level DQ0 and DQ2 signals onto the channel 10 based on the high logic level of the D0 and D2 signals. In contrast, a high logic level DADJ1 signal is provided to the data driver 230(1) from the AND logic 224. The drive strength of the data driver 230(1) may be increased when driving a low logic level DQ1 signal onto the channel 10 based at least in part on the D1 signal.

In the present example, increasing the drive strength of the data driver 230(1) may improve signal integrity. That is, the high logic level DQ0 and DQ2 signals driven onto the channel 10 may affect the driving of the low logic DQ1 signal onto the channel because of crosstalk among the adjacent signal lines for DQ0-DQ2 on the channel 10. For example, without adjusting the data driver 230(1) the DQ1 signal in the present example may not be driven to a low logic level as quickly as in the case where both the DQ0 and DQ2 signals are not being driven to a high logic level. Given that the DQ0 and DQ2 signals are to be driven to a high logic level, however, increasing the drive of the DQ1 signal to a low logic level may compensate for crosstalk with those two signals.

In a similar example, for a high logic level D1 signal and low logic level D0 and D2 signals, the XOR logic 212, 214 both provide high logic level DDET0 and DDET1 signals. In turn, the AND logic 222, 226 again provide low logic level DADJ0 and DADJ2 signals to maintain a nominal drive strength for data drivers 230(0) and 230(2), and the AND logic 224 provides a high logic level DADJ1 signal to increase the drive strength of the data driver 230(1) when driving a high logic level DQ1 signal based at least in part on the D1 signal. Increasing the drive strength for the data driver 230(1) while driving the high logic level DQ1 signal may again compensate for crosstalk due to driving the low logic level D0 and D2 signal onto the channel 10.

Although in the previous example the data drivers 230(0) and 230(2) are not adjusted and the data driver 230(1) is adjusted, in other embodiments the data drivers 230(0) and 230(2) may be alternatively or additionally adjusted. For example, the data drivers 230(0) may be adjusted to decrease respective drive strengths when driving the DQ0 and DQ2 signals onto the channel 10 for the combination of logic levels for the D0-D2 signals previously described, while maintaining a nominal drive strength for the data driver 230(1). The data drivers 230(0) and 230(2) may be adjusted to have decreased drive strength in addition to increasing drive strength of data driver 230(1), or in some embodiments, only the data drivers 230(0) and 230(2) are adjusted.

Moreover, in the embodiment of FIG. 2 a group of data signals to be driven onto three adjacent signal lines were considered. However, in other embodiments fewer or greater adjacent signal lines may be considered for data driver adjustment.

Figure 3:
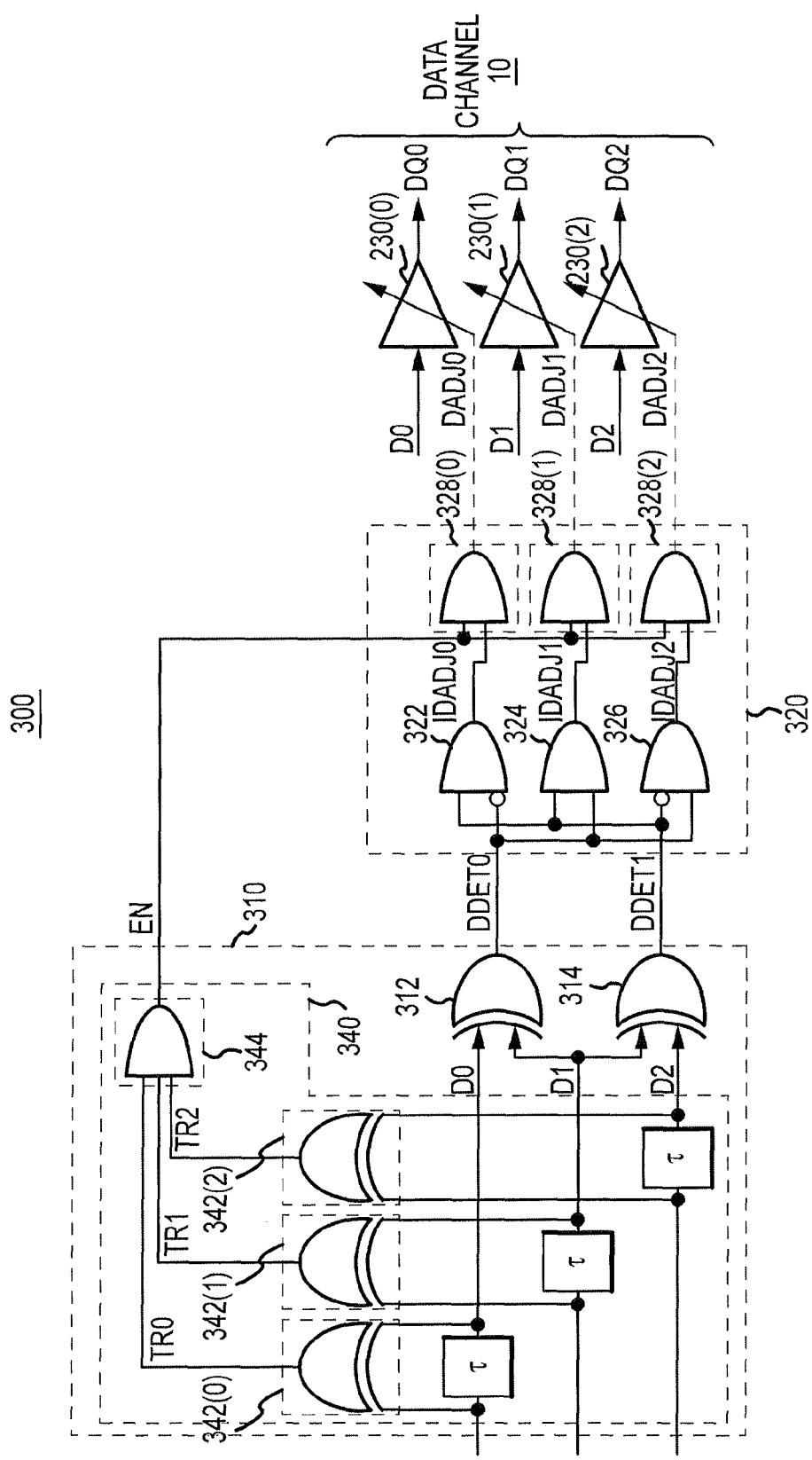
FIG. 3 is a schematic diagram of an output signal driver circuit according to an embodiment of the invention.

FIG. 3 illustrates an output signal driver circuit 300 according to an embodiment of the invention. The output signal driver circuit 300 includes a detection circuit 310 and a driver adjust circuit 320 for a group of three input data signals to be driven as output data signals on adjacent signal lines in channel 10. The detection circuit 310 includes signal transition detection circuit 340 configured to receive data signals D0-D2. The signal transition detection circuit 340 includes transition detectors 342(0)-342(2) configured to detect signal transitions in the D0-D2 signals and provide transition detection signals TR0-TR2 when signal transitions of the data signal is detected. A signal transition occurs for one of the D0-D2 signals when a current logic level for a data signal is different than a previous logic level of the same data signal, and as a result, the respective DQ signal must transition from the previous logic level to the current logic level. The current logic level and the previous logic level is represented in FIG. 3 by signal line delays tau shown for each input signal line providing the D0-D2 signals to the detection circuit 310. The tau delays represent a time delay on the signal line between first and second inputs of respective transition detectors 342(0)-342(2). The first input of the transition detectors 342(0)-342(2) receives a current logic level before the second input, which still receives a previous logic level. As a result, a transition detector 342(0)-342(2) detecting two different logic levels for the first and second inputs will provide an active TR signal indicating a transitioning data signal.

The TR0-TR2 signals are provided to output detection logic 344, which is configured to provide an enable signal EN to driver adjust circuit 320. The EN signal is active based at least in part on all of the D0-D2 signals having a signal transition detected. The output detection logic 344 is illustrated in FIG. 3 as AND logic, however, different logic or combination of logic may be used as well.

The detection circuit 310 further includes XOR (exclusive OR) logic 312, 314 configured to receive the D0-D2 signals and provide DDET0 and DDET1 signals to AND logic 322, 324, 326 included in the driver adjust circuit 320. The DDET0 and DDET1 signals are based at least in part on the logic levels of the D0-D2 signals. The AND logic 322, 324, 326 provides initial adjustment signals IDADJ0-IDADJ2 based on the DDET0 and DDET1 signals to output logic 328(0)-328(2). The output logic 328(0)-328(2) are enabled by the EN signal from the detection circuit 310. In the embodiment of FIG. 3, the output logic 328(0)-328(2) are AND logic, which when enabled by an active EN signal, provide driver adjustment signals DADJ0-DADJ based at least in part on the IDADJ0-IDADJ2 signals. The DADJ0-DADJ2 signals may be used to adjust data drivers 330(0)-330(2) in driving the D0-D2 signals onto the channel 10 as DQ0-DQ2 signals.

The output signal driver circuit 300 may adjust one or more of the data drivers 330(0)-330(2) based at least in part on logic level transitions of the D0-D2 signals, such as when all of the D0-D2 signals have a signal transition from a previous logic level to a current logic level. The drive strengths of the data drivers 330(0)-330(2) may be adjusted based at least in part on the DADJ0-DADJ2 signals. For example, based on the DADJ0-DADJ2 signals from the driver adjust circuit 320 the data drivers 330(0)-330(2) may be adjusted to drive a respective DQ0-DQ2 signal onto the channel 10 with increased drive strength. In another example, the data drivers 330(0)-

330(2) may be adjusted to have decreased drive strength in addition or alternatively to increasing drive strength.

An example where the drive strength of at least one of the data drivers 330(0)-330(2) may be increased occurs when both D0 and D2 signals transition from a previous low logic level to a current high logic level and the D1 signal transitions from a previous high logic level to a current low logic level. As a result, the transition detectors 342(0)-342(2) all provide active TR0-TR2 signals to the output detection logic 344, which in turn provides an active EN signal to the driver adjust circuit 320 indicating that all of the D0-D2 signals transitioned to their respective current logic levels. Moreover, the combination of current logic levels of the D0-D2 signals in the present example (i.e., high, low, high) results in both XOR logic 312, 314 providing high logic level DDET0 and DDET1 signals to the AND logic 322, 324, 326. The AND logic 322, 324, 326 provide IDADJ0-IDADJ2 signals having low, high, and low logic levels to the output logic 328(0)-328(2), which are enabled by the active EN signal provided by the detection circuit 310. The output logic 328(0)-328(2) provide DADJ0-DADJ2 signals having low, high, and low logic levels to adjust the drive strength of the data driver 330(1) (e.g., increased) in driving the DQ1 signal onto the channel 10.

In some embodiments the drive strengths of the data drivers 330(0) and 330(2) are not adjusted based on the low logic levels of the DADJ0 and DADJ2 signals. In other embodiments, the drive strengths of the data drivers 330(0) and 330(2) are adjusted (e.g., decreased) based on the low logic levels of the DADJ0, DADJ2 signals when driving the DQ0 and DQ2 signals onto the channel 10 instead of adjusting the drive strength of the data driver 330(1) based on the high logic level of the DAJ1 signal. In still other embodiments, the drive strengths for all of the data drivers 330(0)-330(2) are adjusted, based on the logic levels of the DADJ0-DADJ2 signals, when driving the DQ0-DQ3 signals onto the channel 10.

FIGS. 2 and 3 illustrate embodiments of output signal driver circuits having detection circuits and driver adjust circuits that include digital logic circuits. In other embodiments, however, detection circuits and driver adjust circuits included in output driver circuits may use analog circuitry. Additionally, the data detection signals and driver adjustment signals may be analog signals rather than digital signals having logic levels. Data drivers may be configured to be adjusted based on analog driver adjustment signals, for example, based at least in part on voltage magnitudes, rather than digital driver adjustment signals. Combinations of analog and digital circuits may be used in output signal driver circuits as well without departing from the scope of the present invention.

FIGS. 4A-4E illustrate a portion of an output signal driver circuit 400 according to an embodiment of the invention. As previously discussed, in some embodiments impedances of data drivers are adjusted based at least in part on a characteristic(s) of the D0-DR signals. The impedances of the data drivers can be adjusted to address changes in signal line impedance due to changes in the data being driven onto the signal lines.

Figure 4A:
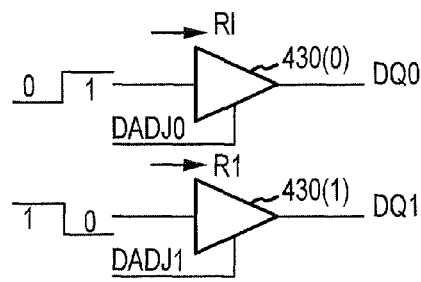
FIGS. 4A-4E are schematic diagrams of a portion of an output signal driver circuit according to an embodiment of the invention.

For example, FIG. 4A illustrates two data drivers 430(0) and 430(1) driving respective signal lines which are adjacent to one another, for example, in a data channel 10. The data signal D0 provided to data driver 430(0) transitions from a low logic level to a high logic level and the data signal D1 provided to the data driver 430(1) transitions from a high logic level to a low logic level. That is, the D0 and D1 signals transition in opposite directions. As a result of the data drivers 430(0), 430(1) driving the D0 and D1 signals as shown in FIG. 4A onto the respective signal lines as DQ0 and DQ1 signals, the signal line impedance for the signal lines will change. Generally, the signal line impedance for the signal lines decrease from a nominal impedance Rnom to a lower impedance R1 when the data to be driven onto the signal lines transition in opposite directions. The data drivers 430(0), 430(1) are adjusted by the driver adjustment signals DADJ0, DADJ1, respectively, to have decreased data driver impedance, for example, R1. In some embodiments, the R1 impedance is a preset impedance for the data driver which is selected based at least in part on the DADJ signal. A preset R1 impedance may model the anticipated decreased signal line impedance of the signal line, and as a result, match the anticipated signal line impedance. By matching the data driver impedance and the signal line impedance, signal reflections due to the DQ0, DQ 1 signal may be reduced.

Figure 4B:
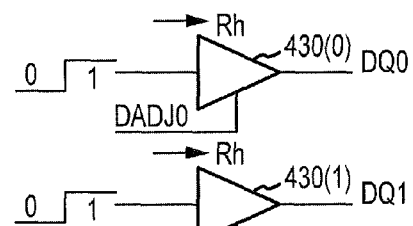
Figure 4C:
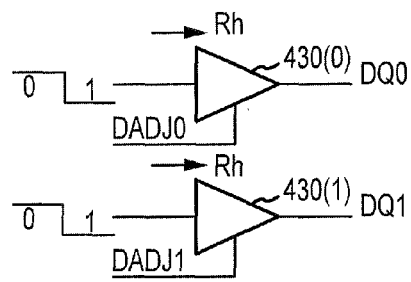

FIGS. 4B and 4C illustrate the data drivers 430(0) and 430(1) for other conditions of the D0 and D1 signals. In particular, the D0 and D1 signals transition in the same direction. In FIG. 4B both the D0 and D1 signals transition from a low logic level to a high logic level and in FIG. 4C both the D0 and D1 signals transition from a high logic level to a low logic level. In these cases, the signal line impedance will generally increase to a higher impedance Rh from the nominal impedance Rnom. The data drivers 430(0), 430(1) are adjusted by the DADJ0, DADJ1 signals, respectively, to have increased data driver impedance, for example, Rh. In some embodiments, the Rh impedance is a preset impedance for the data driver which is selected based at least in part on the DADJ signal. The preset Rh impedance may model the anticipated increased signal line impedance of the signal line, and as a result, match the anticipated signal line impedance. By matching the data driver impedance and the signal line impedance, signal reflections due to the DQ0, DQ 1 signal may be reduced.

Figure 4D:
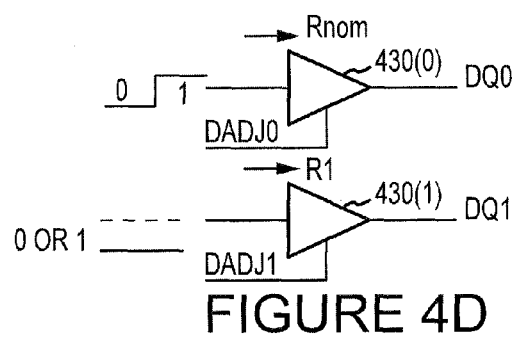
Figure 4E:
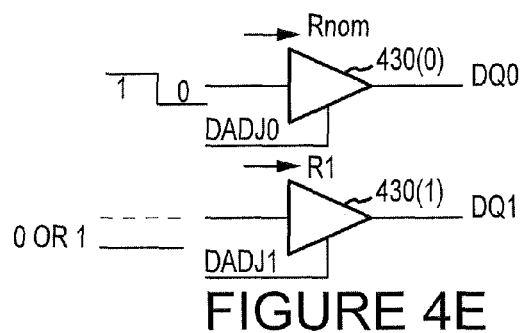

FIGS. 4D and 4E illustrate the data drivers 430(0) and 430(1) for the condition where one of the data signals provided to the data drivers 430(0), 430(1) transitions while the other data signal does not transition. As a result, the signal line onto which the stable data signal is driven (i.e., driven by data driver 430(1)) may decrease from the Rnom impedance to a lower impedance R1 and the signal line onto which the transitioning data signal is driven (i.e., driven by data driver 430(0)) may remain relatively stable at the Rnom impedance. The data driver 430(1) may be adjusted by the DADJ1 signal to have decreased data driver impedance, for example, R1 and the impedance of the data driver 430(0) may remain stable at Rnom. As previously discussed, the R1 impedance may be a present impedance modeling the anticipated decreased signal line impedance.

The DADJ0, DADJ1 signals may be provided to the data drivers 430(0), 430(1), respectively, from a driver adjust circuit (not shown in FIGS. 4A-4E), for example driver adjust circuit 120 (FIG. 1). The characteristic(s) of the data signals D0, D1 may be detected by a detection circuit, for example, detection circuit logic 110, which provides data detections signals to the driver adjust circuit 120 from which the DADJ signals may be at least in part based. For example, with reference to the embodiment of FIG. 4A the detection circuit 110 may be configured to detect a combination of D0, D1 signaling that decreases signal line impedance from the nominal signal line impedance, and as a result, the driver adjust circuit 120 provides DADJ signals to decrease data driver impedance. With reference to the embodiment of FIGS. 4B and 4C, the detection circuit 110 may be configured to detect a combination of D0, D1 signaling that increases signal line impedance from the nominal signal line impedance and the driver adjust circuit 120 provides DADJ signals to increase data driver impedance. With reference to the embodiment of FIGS. 4D and 4E, the detection circuit 110 may be configured to detect a combination of D0, D1 signaling that changes signal line impedance of one signal line from the nominal signal line impedance and maintains signal line impedance on the other signal line. The resulting DADJ signals provided by the driver adjust circuit 120 adjust data driver impedance for one of the data drivers, but maintains the nominal data driver impedance for the other. Examples of detection circuits and driver adjust circuits have been previously discussed, and may be modified for use in the embodiments described with reference to FIGS. 4A-4E. Such modifications are well within the knowledge of those ordinarily skilled in the art.

In some embodiments, the drive strengths of data drivers may be adjusted even if the signal being driven does not change logic states. Adjusting the drive strength of a driver driving an output signal that does not change logic states may clamp the signal line from being affected by crosstalk from transitioning signals driven onto adjacent signal lines. For example, a driver driving a low logic level signal that does not transition for a following data may be adjusted to clamp the driver output to a low logic level voltage to hold the signal low from being affected by crosstalk. Similarly, a driver driving a high logic level signal that does not transition for a following data may be adjusted to clamp the driver output to a high logic level voltage to hold the signal high from being affected by crosstalk.

Figure 5:
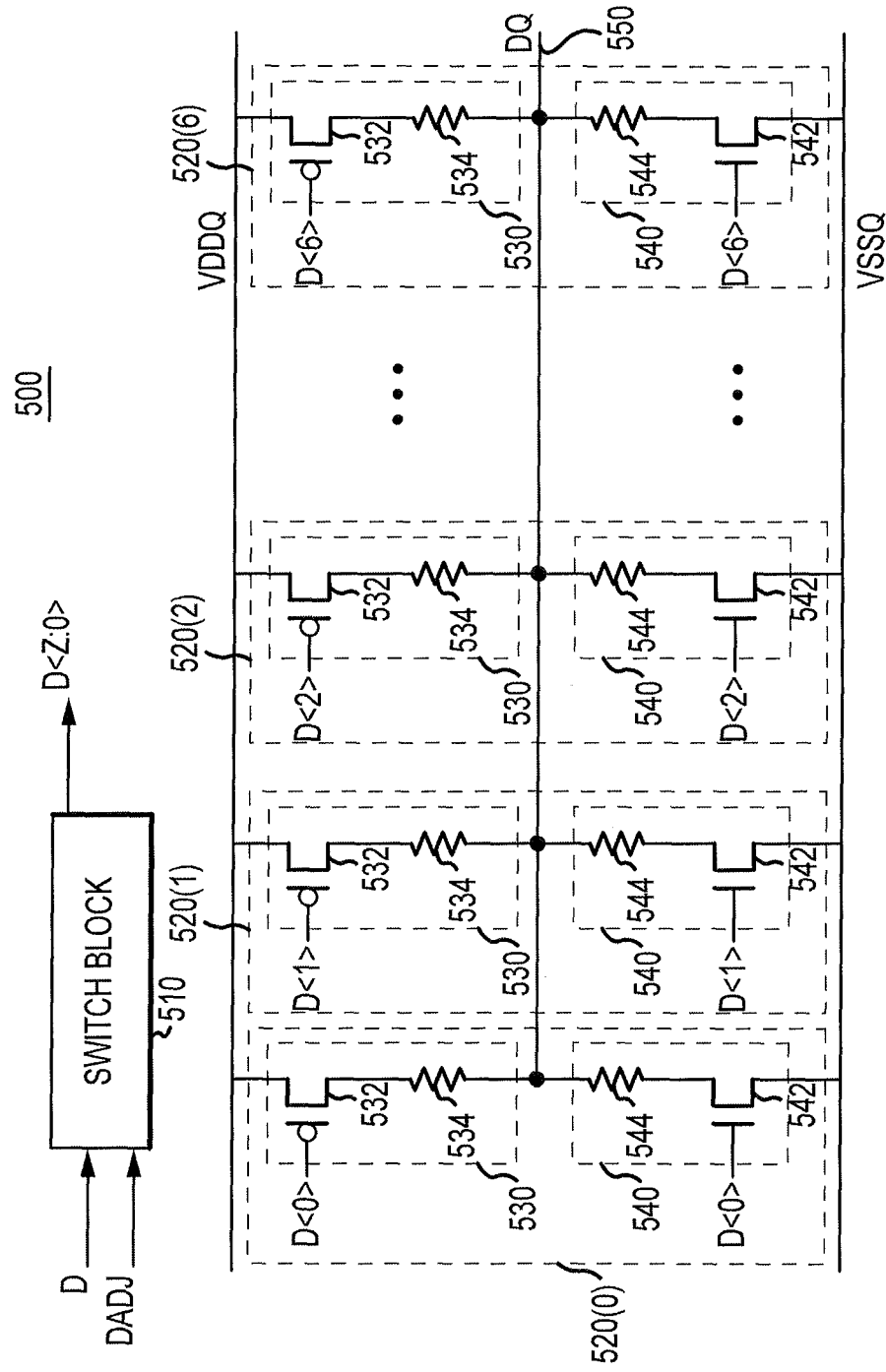
FIG. 5 is a schematic diagram of a data driver that may be used in embodiments of the invention.

FIG. 5 illustrates a data driver 500. The data driver 500 may be used as the data drivers in embodiments of the invention, for example, for data drivers 130, 230, 330, and 430 of FIGS. 1-4, respectively.

The data driver 500 is configured to receive a data signal D and drive an output data signal DQ based at least in part on the data signal D. The output data signal is driven onto a signal line 550, for example, a signal line of data channel 10. The data driver 500 includes a switch block 510 that receives the D signal and adjustment signal DADJ. The switch block 510 is configured to provide the D signal (illustrated in FIG. 5 as D <Z:0> signals) to one or more of driver legs 520(0)-520(Z) based at least in part on the DADJ signal. The driver legs 520 include a pull-up circuit 530 that includes switch 532 and resistance 534 and further include a pull-down circuit 540 that includes switch 542 and resistance 544. The switch 532 is illustrated in FIG. 5 as a p-channel field effect transistor (PFET) and the switch 542 as an n-channel FET (NFET). Other circuits may be used for the switches 532 and 542 as well. The resistances 534 and 544 may have the same magnitude for each of the driver legs 520, or in some embodiments, at least one of the driver legs 520 has resistances that are different magnitudes from the other driver legs 520.

In operation, the switch block 510 may provide the D signal to at least driver leg 520(0) to drive the DQ signal based at least in part on the D signal. A high logic level D signal opens the switch 532 of the pull-up circuit 530 and closes the switch 542 of the pull-down circuit 540 to couple the signal line 550 to a data reference voltage, for example, VSSQ. As a result, the signal line 550 is pulled down to the VSSQ voltage to drive a low logic level DQ signal. Conversely, a low logic level D signal opens the switch 542 and also closes the switch 532 to couple the signal line 550 to a data supply voltage, for example, VDDQ. As a result, the signal line 550 is pulled up to the VDDQ voltage based on a low D signal to drive a high logic level DQ signal.

The DADJ signal controls the switch block 510 to provide the D signal to additional driver legs 520, thereby increasing the number of conductive paths for coupling the signal line 550 to either VDDQ or VSSQ. As a result, the drive strength may be increased when driving the DQ signal onto the signal line 550. Providing the D signal to additional driver legs 520 may also change the data driver output impedance. For example, the increased number of resistances 534, 544 coupled in parallel to the signal line 550 decreases the output impedance.

In some embodiments, the switch block 510 provides the D signal to an initial number of driver legs 520 and the DADJ signal may control the switch block 510 to decrease the number of driver legs 520 the D signal is provided from the initial number, thereby decreasing the drive strength of the driver for driving the DQ signal (and increasing the data driver output impedance). In some embodiments, the DADJ signal may also control the switch block 510 to increase the number of driver legs 520 the D signal is provided from the initial number, thereby increasing the drive strength of the data driver for driving the DQ signal (and decreasing the data driver output impedance). Thus, such a data driver may be adjusted to have increased or decreased drive strength (decreased and increased data driver output impedance, respectively) based at least in part on the DADJ signal.

The number of driver legs 520 that are increased or decreased based at least in part on the DADJ signal may be such to provide a desired data driver adjustment resolution. Logic circuits may be included in the switch block 510 to control how many switches of the driver legs 520 are provided the D signal based at least in part on the DADJ signal. Multibit DADJ signals may provide higher data driver adjustment resolution. However, the complexity of the circuitry providing the D signal to the driver legs 520 may be increased as a result. Conventional circuits well known by those ordinarily skilled in the art may be used to provide such circuitry.

Figure 6:
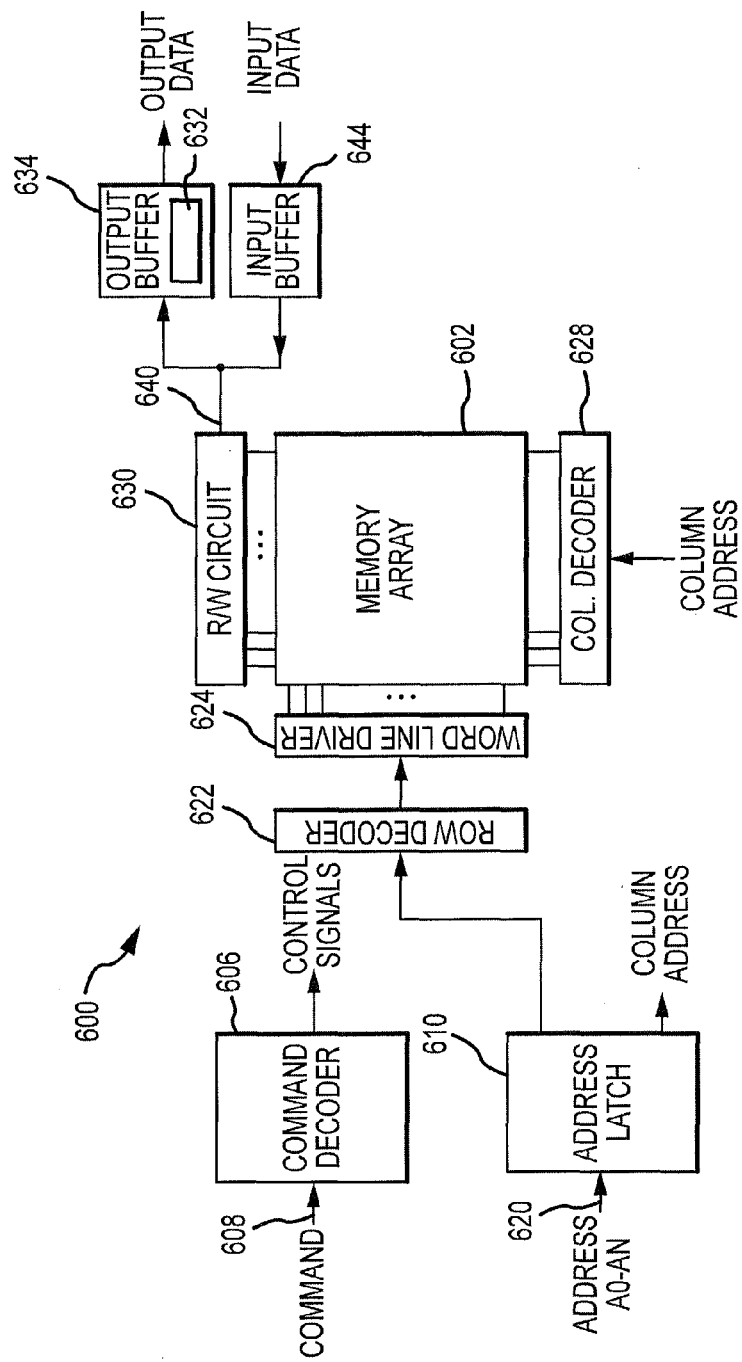
FIG. 6 is a block diagram of a memory including an output signal driver circuit according to an embodiment of the invention.

Embodiments of the invention may be utilized in various electronic circuits that include data drivers, or need to drive signals over signal lines that may be subject to cross-talk or changes in line impedance. For example, the output signal drivers may be utilized in processor circuits, controllers, and memories, to name a few. For example, FIG. 6 illustrates a memory 600 according to an embodiment of the invention. The memory 600 includes an output signal driver circuit according to an embodiment of the invention. The memory system 600 includes an array 602 of memory cells, which may be, for example, DRAM memory cells, SRAM memory cells, flash memory cells, or some other types of memory cells. The memory system 600 includes a command decoder 606 that receives memory commands through a command bus 608 and generates corresponding control signals within the memory system 600 to carry out various memory operations. Row and column address signals are applied to the memory system 600 through an address bus 620 and provided to an address latch 610. The address latch then outputs a separate column address and a separate row address.

The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses. The selected data line (e.g., a bit line or bit lines) corresponding to a received column address are coupled to a read/write circuitry 630 to provide read data to a data output buffer 634 via an input-output data bus 640. The data buffer 634 includes an output signal driver circuit 632 according to an embodiment of the invention. The output signal driver circuit 632 is configured to adjust data drivers in the data output buffer 634 when driving output data based at least in part on a characteristic(s) of the read data the data output buffer 634 receives. Write data are applied to the memory array 602 through a data input buffer 644 and the memory array read/write circuitry 630. The command decoder 606 responds to memory commands applied to the command bus 608 to perform various operations on the memory array 602. In particular, the command decoder 606 is used to generate internal control signals to read data from and write data to the memory array 602.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
    a detection circuit configured to receive a group of input data signals to be driven as output data signals onto adjacent signal lines, the detection circuit configured to provide a detection signal based at least in part on a characteristic of the group of input data signals;
    a driver adjust circuit configured to provide a driver adjustment signal based at least in part on the detection signal; and
    a data driver configured to drive a respective one of the output data signals onto a respective one of the signal lines, wherein the data driver is configured to be adjusted based at least in part on the driver adjustment signal and wherein the driver adjustment signal is configured to adjust a drive strength of the data driver based at least in part on transitioning of the respective one of the input data signals and another input data signal of the group to be driven onto another signal line adjacent to the respective one of the signal lines.

2. The apparatus of claim 1 wherein the driver adjustment signal is configured to adjust an impedance of the data driver.

3. The apparatus of claim 2 wherein the driver adjustment signal is configured to adjust the impedance of the data driver based at least in part on transitioning of the respective one of the input data signals and another input data signal of the group to be driven onto another signal line adjacent to the respective one of the signal lines.

4. The apparatus of claim 1 wherein the adjacent signal lines comprise at least two adjacent output signal lines.

5. The apparatus of claim 1 wherein the adjacent signal lines comprise at least three adjacent output signal lines.

6. The apparatus of claim 1 wherein the characteristic of the group of data signals comprises a particular combination of transitions of the input data signals.

7. The apparatus of claim 1 wherein the characteristic of the group of input data signals comprises a particular combination of logic levels of the input data signals.

8. The apparatus of claim 1 wherein the driver adjustment signal is an analog signal.

9. The apparatus of claim 1 wherein the data driver is a binary data driver.

10. An apparatus, comprising:
    a detection circuit configured to receive a group of input data signals and provide detection signals based at least in part on a characteristic of the group of input data signals, wherein the group of data signals are to be driven as output data signals onto adjacent signal lines;
    a driver adjust circuit configured to provide driver adjustment signals based at least in part on the detection signals; and
    data drivers, wherein each of the data drivers is configured to drive a respective one of the output data signals onto a respective one of the adjacent signal lines based at least in part on a respective one of the driver adjustment signals, wherein a respective one of the adjacent signal lines onto which the first one of the group of input data signals is driven is between respective ones of the adjacent signal lines onto which the second and third ones of the group of input data signals are driven.

11. The apparatus of claim 10 wherein the detection circuit is configured to provide the detection signals based at least in part on a combination of logic levels of the group of input data signals.

12. The apparatus of claim 11 wherein the combination of logic levels comprises a first one of the group of input data signals having a first logic level, and second and third ones of the group of input data signals having a second logic level.

13. The apparatus of claim 10 wherein the detection circuit is configured to provide the detection signals based at least in part on a combination of signal transitions of the group of input data signals.

14. The apparatus of claim 13 wherein the combination of signal transitions of the group of input data signals comprises a first one of the group of input data signals transitioning from a first logic level to a second logic level, and second and third ones of the group of input data signals transitioning from the second logic level to the first logic level.

15. The apparatus of claim 10 wherein each of the data drivers comprises:
    driver legs coupled to a respective one of the adjacent signal lines, wherein each of the driver legs is configured to drive the respective input data signal onto the respective one of the adjacent signal lines as a respective one of the output data signals based at least in part on being provided the respective input data signal.

16. The apparatus of claim 15 wherein each of the driver legs comprises:
    a pull-up leg configured to be provided a first voltage level; and
    a pull-down leg configured to be provided a second voltage level.

17. The apparatus of claim 16 wherein the pull-up leg comprises a first switch and a first resistance and the pull-down leg comprises a second switch and a second resistance.

18. The apparatus of claim 16 wherein the first voltage comprises a data supply voltage and the second voltage comprises ground.

19. The apparatus of claim 10 wherein the adjacent signal lines are included in a data channel.

20. A method, comprising:
    detecting a characteristic of a group of input data signals to be driven by drivers as output data signals onto adjacent signal lines; and
    adjusting a drive strength of a respective one of the drivers based at least in part on detecting the characteristic to compensate for signal crosstalk between a respective one of the adjacent signal lines and another signal line of the adjacent signal lines.

21. The method of claim 20, wherein the characteristic comprises each of the group of input data signals transitioning from a respective previous logic level to a respective current logic level, and wherein adjusting a respective one of the drivers comprises adjusting a drive strength of the respective one of the drivers.

22. The method of claim 20 wherein the adjacent signal lines comprise a center signal line between a first signal line and a second signal line, and wherein the characteristic comprises a logic level of respective ones of the input data signals to be driven onto the first and second adjacent signal lines being different than a logic level of a respective one of the input data signals to be driven onto the center signal line.

23. The method of claim 20 wherein adjusting the drive strength comprises:
providing an input data signal to additional driver legs to increase the drive strength and providing the input data signal to fewer driver legs to decrease the drive strength.

24. The method of claim 20 wherein adjusting a respective one of the drivers comprises adjusting an impedance of the respective one of the drivers.

25. The method of claim 24 wherein the characteristic comprises a particular combination of logic levels for the group of input data signals.

26. The method of claim 24 wherein adjusting an impedance of the respective one of the drivers comprises adjusting the impedance to match an impedance of a respective one of the signal lines.

27. An apparatus, comprising:
a detection circuit configured to receive a group of input data signals to be driven as output data signals onto adjacent signal lines, the detection circuit configured to provide a detection signal based at least in part on a characteristic of the group of input data signals;
a driver adjust circuit configured to provide a driver adjustment signal based at least in part on the detection signal; and
a data driver configured to drive a respective one of the output data signals onto a respective one of the signal lines, wherein the data driver is configured to be adjusted based at least in part on the driver adjustment signal, wherein the driver adjustment signal is configured to adjust an impedance of the data driver based at least in part on transitioning of the respective one of the input data signals and another input data signal of the group to be driven onto another signal line adjacent to the respective one of the signal lines.

28. A method, comprising:
detecting a characteristic of a group of input data signals to be driven by drivers as output data signals onto adjacent signal lines; and
adjusting a respective one of the drivers based at least in part on detecting the characteristic, wherein the adjacent signal lines comprise a center signal line between a first signal line and a second signal line, and wherein the characteristic comprises a logic level of respective ones of the input data signals to be driven onto the first and second adjacent signal lines being different than a logic level of a respective one of the input data signals to be driven onto the center signal line.

* * * * *

UNITED STATES PATENT AND TRADEMARK OFFICE
CERTIFICATE OF CORRECTION

PATENT NO. : 8,497,706 B2  
APPLICATION NO. : 13/210259  
DATED : July 30, 2013  
INVENTOR(S) : Timothy M. Hollis et al.

Page 1 of 1

It is certified that error appears in the above-identified patent and that said Letters Patent is hereby corrected as shown below:

Title Page, Item (57), under "Abstract", column 2, line 8, delete "for," and insert -- for --, therefor.

Signed and Sealed this  
Twenty-ninth Day of October, 2013

Teresa Stanek Rea  
*Deputy Director of the United States Patent and Trademark Office*